US012144125B2

(12) United States Patent
Takano et al.

(10) Patent No.: US 12,144,125 B2
(45) Date of Patent: Nov. 12, 2024

(54) PRESSURE-SENSITIVE ADHESIVE SHEET-INCLUDING WIRING CIRCUIT BOARD AND PRODUCING METHOD THEREOF

(71) Applicant: NITTO DENKO CORPORATION, Osaka (JP)

(72) Inventors: Takahiro Takano, Osaka (JP); Takahiro Minatoya, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 634 days.

(21) Appl. No.: 17/075,061

(22) Filed: Oct. 20, 2020

(65) Prior Publication Data
US 2021/0127499 A1 Apr. 29, 2021

(30) Foreign Application Priority Data
Oct. 23, 2019 (JP) .................. 2019-193054

(51) Int. Cl.
*H05K 1/02* (2006.01)
*H05K 1/11* (2006.01)
(Continued)

(52) U.S. Cl.
CPC ........... *H05K 3/386* (2013.01); *H05K 1/0281* (2013.01); *H05K 1/11* (2013.01); *H05K 5/0247* (2013.01);
(Continued)

(58) Field of Classification Search
CPC ........ H05K 3/386; H05K 1/11; H05K 5/0247; H05K 3/007; H05K 3/4635; H05K 3/0064;
(Continued)

(56) References Cited

U.S. PATENT DOCUMENTS 5,578,365 A * 11/1996 Kume ...................... G09F 3/10
428/688
5,583,320 A * 12/1996 Eriguchi .............. H05K 3/0064
174/254

(Continued)

FOREIGN PATENT DOCUMENTS

JP       6-38436 Y2    10/1994
JP    2007-012713 A     1/2007
(Continued)

OTHER PUBLICATIONS

Office Action, issued by the Japanese Patent Office on Sep. 5, 2023, in connection with Japanese Patent Application No. 2019-193054.
(Continued)

*Primary Examiner* — Ishwarbhai B Patel

(74) *Attorney, Agent, or Firm* — Edwards Neils LLC; Jean C. Edwards, Esq.

(57) ABSTRACT

A pressure-sensitive adhesive sheet-including wiring circuit board includes a wiring circuit board including a base insulating layer, a conductive layer disposed on a one-side surface in a thickness direction of the base insulating layer, and a cover insulating layer disposed on the one-side surface in the thickness direction of the base insulating layer so as to cover the conductive layer, and a pressure-sensitive adhesive sheet disposed on the surface of either one side or the other side in the thickness direction of the wiring circuit board.

5 Claims, 10 Drawing Sheets

(51) Int. Cl.
*H05K 3/38* (2006.01)
*H05K 5/02* (2006.01)
*H05K 1/05* (2006.01)
*H05K 3/00* (2006.01)

(52) U.S. Cl.
CPC .............. *H05K 1/056* (2013.01); *H05K 1/111* (2013.01); *H05K 3/007* (2013.01)

(58) Field of Classification Search
CPC ... H05K 2203/0152; H05K 2203/0156; H05K 2203/1383; H05K 1/02; H05K 3/0058
See application file for complete search history.

(56) References Cited

U.S. PATENT DOCUMENTS

| | | | | |
|---|---|---|---|---|
| 6,313,526 | B1* | 11/2001 | Nakamura | H05K 3/0097 |
| | | | | 257/668 |
| 7,439,451 | B2* | 10/2008 | Naito | H01L 21/67132 |
| | | | | 174/258 |
| 9,085,685 | B2* | 7/2015 | Morita | C08K 5/09 |
| 9,202,795 | B2* | 12/2015 | Oda | H01L 24/29 |
| 2009/0263748 | A1* | 10/2009 | Takemura | H05K 3/108 |
| | | | | 430/312 |
| 2018/0007799 | A1* | 1/2018 | Jeong | H05K 3/38 |
| 2018/0288883 | A1 | 10/2018 | Sakakura et al. | |
| 2020/0105656 | A1 | 4/2020 | Shibata et al. | |
| 2020/0329560 | A1 | 10/2020 | Shibata et al. | |

FOREIGN PATENT DOCUMENTS

| | | |
|---|---|---|
| JP | 2007-235067 A | 9/2007 |
| JP | 2008-004631 A | 1/2008 |
| JP | 2012-129472 A | 7/2012 |
| JP | 2018-166134 A | 10/2018 |
| JP | 2019-068032 A | 4/2019 |
| JP | 2019-079996 A | 5/2019 |

OTHER PUBLICATIONS

Office Action, issued by the Japanese Patent Office on Jan. 23, 2024, in connection with Japanese Patent Application No. 2019-193054.
Decision of Refusal, issued by the Japanese Patent Office on Jun. 25, 2024, in connection with Japanese Patent Application No. 2019-193054.
Decision of Dismissal of Amendment, issued by the Japanese Patent Office on Jun. 25, 2024, in connection with Japanese Patent Application No. 2019-193054.

* cited by examiner

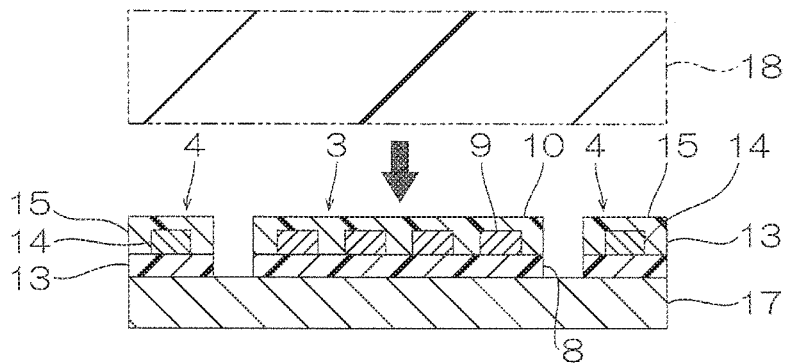
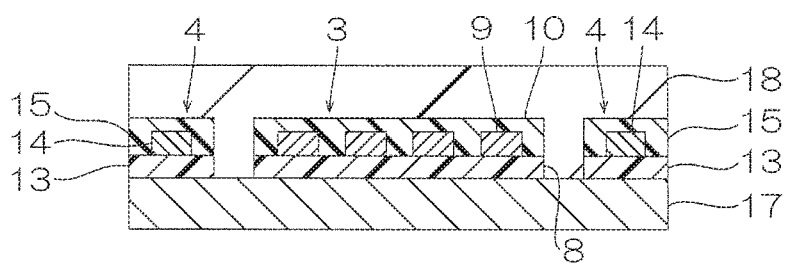
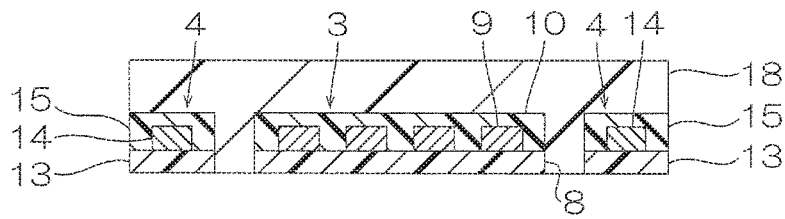
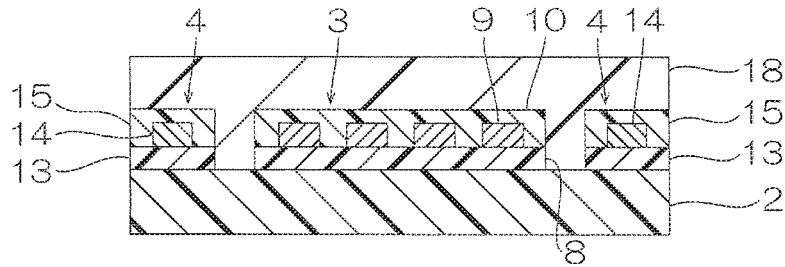
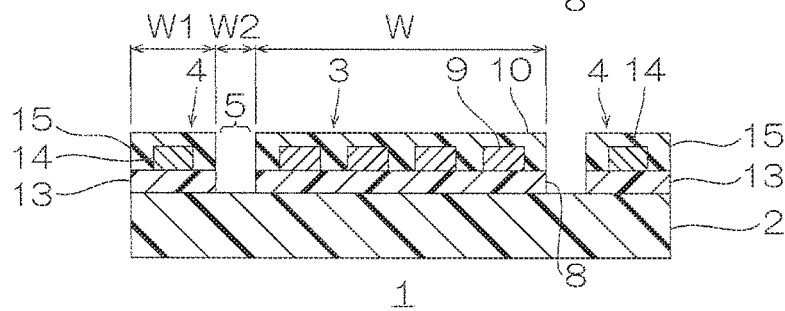

FIG. 3A
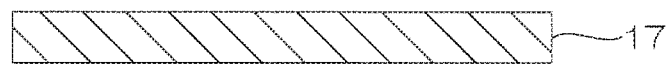
FIG. 3B
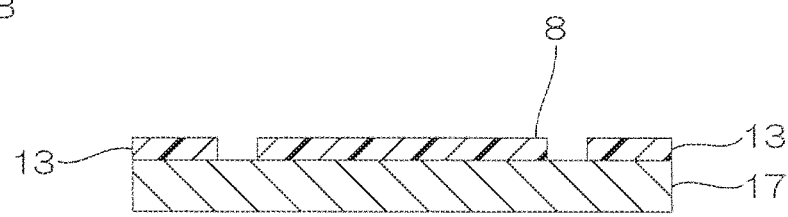
FIG. 3C
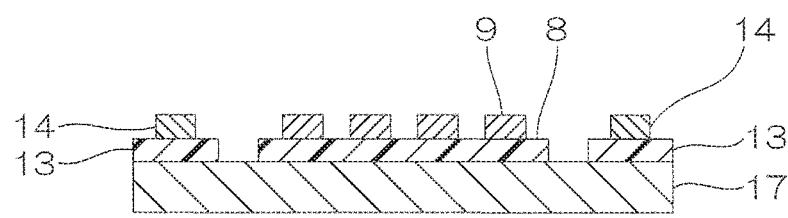
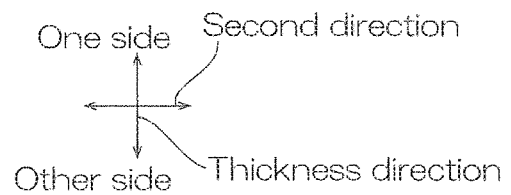

PRESSURE-SENSITIVE ADHESIVE SHEET-INCLUDING WIRING CIRCUIT BOARD AND PRODUCING METHOD THEREOF

CROSS REFERENCE TO RELATED APPLICATION

The present application claims priority from Japanese Patent Application No 2019-193054 filed on Oct. 23, 2019, the contents of which are hereby incorporated by reference into this application.

TECHNICAL FIELD

The present invention relates to a pressure-sensitive adhesive sheet-including wiring circuit board and a producing method thereof.

BACKGROUND ART

Conventionally, a wiring circuit board holding sheet holding a wiring circuit board on a sheet has been known.

For example, a wiring circuit board holding sheet including a wiring circuit board, a joint portion, and a sheet for holding the wiring circuit board through the joint portion has been proposed (ref: for example. Patent Document 1 below).

PRIOR ART DOCUMENT

Patent Document

[Patent Document 1] Japanese Unexamined Patent Publication No. 2007-012713

SUMMARY OF THE INVENTION

Problems to be Solved by the Invention

However, in the wiring circuit board holding sheet described in Patent Document 1, by cutting the joint portion, the wiring circuit board is separated from the sheet. The wiring circuit board separated from the sheet has a cut piece (cut end) of the joint portion. Therefore, when the wiring circuit board is mounted in a narrow region, there is a problem that the cut piece of the joint portion described above is hindered.

The present invention provides a pressure-sensitive adhesive sheet-including wiring circuit board capable of separating a wiring circuit board from a pressure-sensitive adhesive sheet and smoothly mounting such a wiring circuit board in a narrow region, and a producing method thereof.

Solution to the Problems

The present invention (1) includes a pressure-sensitive adhesive sheet-including wiring circuit board including a wiring circuit board including a base insulating layer, a conductive layer disposed on a one-side surface in a thickness direction of the base insulating layer, and a cover insulating layer disposed on the one-side surface in the thickness direction of the base insulating layer so as to cover the conductive layer, and a pressure-sensitive adhesive sheet disposed on the surface of either one side or the other side in the thickness direction of the wiring circuit board.

In the pressure-sensitive adhesive sheet-including wiring circuit board, only by peeling the wiring circuit board from the pressure-sensitive adhesive sheet, it is possible to obtain the wiring circuit board without having the cut piece (cut end) described above. Therefore, such a wiring circuit board can be smoothly mounted in a narrow region.

The present invention (2) includes the pressure-sensitive adhesive sheet-including wiring circuit board described in (1), wherein the wiring circuit board has a length of 300 mm or more.

However, in a case where the wiring circuit board has a length of 300 mm or more, when the wiring circuit board is held by the sheet through a join portion, since it is inevitable to provide a large number of joint portions, the number of cut piece described above is increased, and therefore, the above-described problem is apparent.

However, in the pressure-sensitive adhesive sheet-including wiring circuit board, it is possible to obtain the wiring circuit board without having the cut piece (cut end) described above. Therefore, even the long wiring circuit board can be smoothly mounted in a narrow region.

The present invention (3) includes the pressure-sensitive adhesive sheet-including wiring circuit board described in (1) or (2) further including a reinforcement substrate surrounding the wiring circuit board at intervals thereto in a plane direction perpendicular to the thickness direction of the wiring circuit board, wherein the pressure-sensitive adhesive sheet includes the wiring circuit board and the reinforcement substrate when projected in the thickness direction, is continuous in the plane direction, and is disposed on the surface of the same side as the surface of the wiring circuit board in the reinforcement substrate.

Since the pressure-sensitive adhesive sheet-including wiring circuit board further includes the reinforcement substrate that is included in the pressure-sensitive adhesive sheet when projected in the thickness direction and is continuous in the plane direction, it can reinforce the pressure-sensitive adhesive sheet corresponding to the reinforcement substrate. Therefore, it is possible to smoothly and reliably peel the wiring circuit board from the pressure-sensitive adhesive sheet.

The present invention (4) includes the pressure-sensitive adhesive sheet-including wiring circuit board described in (3), wherein the reinforcement substrate includes a reinforcement conductive layer.

In the pressure-sensitive adhesive sheet-including wiring circuit board, since the reinforcement substrate includes the reinforcement conductive layer, it can further reinforce the pressure-sensitive adhesive sheet corresponding to the reinforcement substrate, and the wiring circuit board can be further more smoothly and reliably peeled from the pressure-sensitive adhesive sheet.

The present invention (5) includes the pressure-sensitive adhesive sheet-including wiring circuit board described in (4), wherein the reinforcement conductive layer has a generally lattice shape when viewed from the top.

In the pressure-sensitive adhesive sheet-including wiring circuit board, since the reinforcement conductive layer has a generally lattice shape when viewed from the top, it is possible to uniformly reinforce the pressure-sensitive adhesive sheet corresponding to the reinforcement substrate, while the material cost is reduced.

The present invention (6) includes the pressure-sensitive adhesive sheet-including wiring circuit board described in any one of (1) to (5), wherein the wiring circuit board further includes a metal support layer disposed on an other-side surface in the thickness direction of the base insulating layer.

In the pressure-sensitive adhesive sheet-including wiring circuit board, since the wiring circuit board further includes the metal support layer, it is possible to obtain the wiring circuit board having excellent toughness.

The present invention (7) includes a method for producing a pressure-sensitive adhesive sheet-including wiring circuit board including a first step of forming a wiring circuit board on a one-side surface in a thickness direction of a support sheet by forming a base insulating layer, a conductive layer, and a cover insulating layer in order on the one-side surface in the thickness direction of the support sheet toward one side in the thickness direction, a second step of bringing a second support sheet into contact with the one-side surface in the thickness direction of the wiring circuit board, and a third step of removing a portion corresponding to the wiring circuit board in the support sheet.

In the method for producing a pressure-sensitive adhesive sheet-including wiring circuit board, by an easy method in which the wiring circuit board is formed on the one-side surface in the thickness direction of the support sheet, the second support sheet is brought into contact with the one-side surface in the thickness direction of the wiring circuit board, and a portion corresponding to the wiring circuit board in the support sheet is removed, the wiring circuit board without having the cut piece (cut end) described above can be obtained.

The present invention (8) includes the method for producing a pressure-sensitive adhesive sheet-including wiring circuit board described in (7) further including a fourth step of allowing a pressure-sensitive adhesive sheet to pressure-sensitively adhere to an other-side surface in the thickness direction of the wiring circuit board after the third step and a fifth step of removing the second support sheet after the fourth step, wherein in the third step, the support sheet is removed.

In the method for producing a pressure-sensitive adhesive sheet-including wiring circuit board, the pressure-sensitive adhesive sheet pressure-sensitively adheres to the other-side surface in the thickness direction of the wiring circuit board, and thereafter, the support sheet is removed. Therefore, when the wiring circuit board is separated from the pressure-sensitive adhesive sheet, it is possible to easily obtain the wiring circuit board without having the cut piece (cut end) described above.

The present invention (9) includes the method for producing a pressure-sensitive adhesive sheet-including wiring circuit board described in (7), wherein the second support sheet is a pressure-sensitive adhesive sheet.

In the method for producing a pressure-sensitive adhesive sheet-including wiring circuit board, the one-side surface in the thickness direction of the wiring circuit board can be reliably reinforced by the second support sheet that is the pressure-sensitive adhesive sheet, and in the third step thereafter, since the support sheet is removed, it is possible to easily and reliably obtain the wiring circuit board.

The present invention (10) includes the method for producing a pressure-sensitive adhesive sheet-including wiring circuit board described in any one of (7) to (9), wherein in the third step, a portion around the wiring circuit board in the support sheet is removed.

In the method for producing a pressure-sensitive adhesive sheet-including wiring circuit board, the wiring circuit board can be reliably separated from the outer-side portion of the portion in the support sheet.

The present invention (11) includes the method for producing a pressure-sensitive adhesive sheet-including wiring circuit board described in (10), wherein in the third step, a metal support layer disposed on the other-side surface in the thickness direction of the base insulating layer is formed from the metal sheet.

In the method for producing a pressure-sensitive adhesive sheet-including wiring circuit board, since the metal support layer disposed on the other-side surface in the thickness direction of the base insulating layer is formed, it is possible to obtain the wiring circuit board having excellent toughness.

The present invention (12) includes the method for producing a pressure-sensitive adhesive sheet-including wiring circuit board described in (10) or (11) further including a sixth step of transferring the wiring circuit board from the pressure-sensitive adhesive sheet to a second pressure-sensitive adhesive sheet.

In the method for producing a pressure-sensitive adhesive sheet-including wiring circuit board, since in the sixth step, the wiring circuit board is transferred from the pressure-sensitive adhesive sheet to the second pressure-sensitive adhesive sheet, when the wiring circuit board is separated from the second pressure-sensitive adhesive sheet, it is possible to easily obtain the wiring circuit board without having the cut piece (cut end) described above.

The present invention (13) includes the method for producing a pressure-sensitive adhesive sheet-including wiring circuit board described in any one of (7) to (12), wherein the wiring circuit board has a length of 300 mm or more.

However, in a case where the wiring circuit board has a length of 300 mm or more, when the wiring circuit board is held by the sheet through the joint portion, since it is inevitable to provide a large number of joint portions, the number of cut piece described above is increased, and therefore, labor for cutting the pieces is significantly increased.

However, in the method for producing a pressure-sensitive adhesive sheet-including wiring circuit board, since the wiring circuit board without having the cut piece (cut end) described above is obtained, even the wiring circuit board having a length of 300 mm or more can be produced by separating the wiring circuit board from the pressure-sensitive adhesive sheet by an easy method of peeling the wiring circuit board from the pressure-sensitive adhesive sheet.

The present invention (14) includes the method for producing a pressure-sensitive adhesive sheet-including wiring circuit board described in any one of (7) to (13), wherein in the first step, a reinforcement substrate surrounding the wiring circuit board at intervals thereto is formed on the one-side surface in the thickness direction of the support sheet, and in the second step, the second support sheet is brought into contact with the one-side surface of the reinforcement substrate.

In the method for producing a pressure-sensitive adhesive sheet-including wiring circuit board, since in the second step, the second support sheet is brought into contact with the one-side surface of the reinforcement substrate, it is possible to reinforce the second support sheet corresponding to the reinforcement substrate.

Effect of the Invention

According to the pressure-sensitive adhesive sheet-including wiring circuit board of the present invention, a wiring circuit board can be smoothly mounted in a narrow region.

According to the method for producing a pressure-sensitive adhesive sheet-including wiring circuit board of the present invention, it is possible to obtain a wiring circuit board without having a cut piece by an easy method.

BRIEF DESCRIPTION OF THE DRAWINGS

FIGS. 2A to 2F show cross-sectional views for illustrating a production process of the pressure-sensitive adhesive sheet-including wiring circuit board shown in FIG. 1:

FIG. 2A illustrating a first step of forming a wiring circuit board on a one-side surface in a thickness direction of a support sheet, FIG. 2B illustrating a second step of bringing a second support sheet into contact with the one-side surface in the thickness direction of the wiring circuit board, FIG. 2C illustrating a third step of removing the support sheet, FIG. 2D illustrating a fourth step of allowing a pressure-sensitive adhesive sheet to pressure-sensitively adhere to the other-side surface in the thickness direction of the wiring circuit board, FIG. 2E illustrating a fifth step of removing the second support sheet, and FIG. 2F illustrating a step of peeling the wiring circuit board from the pressure-sensitive adhesive sheet.

FIGS. 3A to 3C show production process views for further illustrating a step of forming the wiring circuit board shown in FIG. 2A:

FIG. 3A illustrating a step of preparing a support sheet,

FIG. 3B illustrating a step of forming a base insulating layer, and

FIG. 3C illustrating a step of forming a conductive layer.

FIG. 4A illustrating a cross-sectional view along a longitudinal direction and

FIG. 4B illustrating a cross-sectional view along an X-X line of FIG. 4A.

FIG. 5A illustrating a plan view and

FIG. 5B illustrating a cross-sectional view.

FIG. 7A illustrating a second step of allowing a pressure-sensitive adhesive sheet to pressure-sensitively adhere to a one-side surface in a thickness direction of a wiring circuit board, FIG. 7B illustrating a third step of removing a support sheet, and FIG. 7C illustrating a step of peeling the wiring circuit board from the pressure-sensitive adhesive sheet.

FIG. 8A illustrating a step of disposing each of two photoresists with respect to each of a support sheet and a wiring circuit board, FIG. 8B illustrating a step of exposing a first photoresist to form a latent image.

FIG. 8C illustrating a step of removing a second photoresist, and

FIG. 8D illustrating a second step of allowing a pressure-sensitive adhesive sheet to pressure-sensitively adhere to a one-side surface in a thickness direction of the wiring circuit board.

FIG. 9E illustrating a step of developing the first photoresist to form an etching resist, FIG. 9F illustrating a step of removing a portion around the wiring circuit board in a support sheet by etching, FIG. 9G illustrating a step of removing the etching resist, and FIG. 9H illustrating a step of peeling the wiring circuit board from the pressure-sensitive adhesive sheet.

FIG. 10A illustrating a step of allowing a second pressure-sensitive adhesive sheet to pressure-sensitively adhere to an other-side surface in a thickness direction of a wiring circuit board and FIG. 10B illustrating a step of peeling the wiring circuit board from a pressure-sensitive adhesive sheet.

EMBODIMENT OF THE INVENTION

Figure 1:
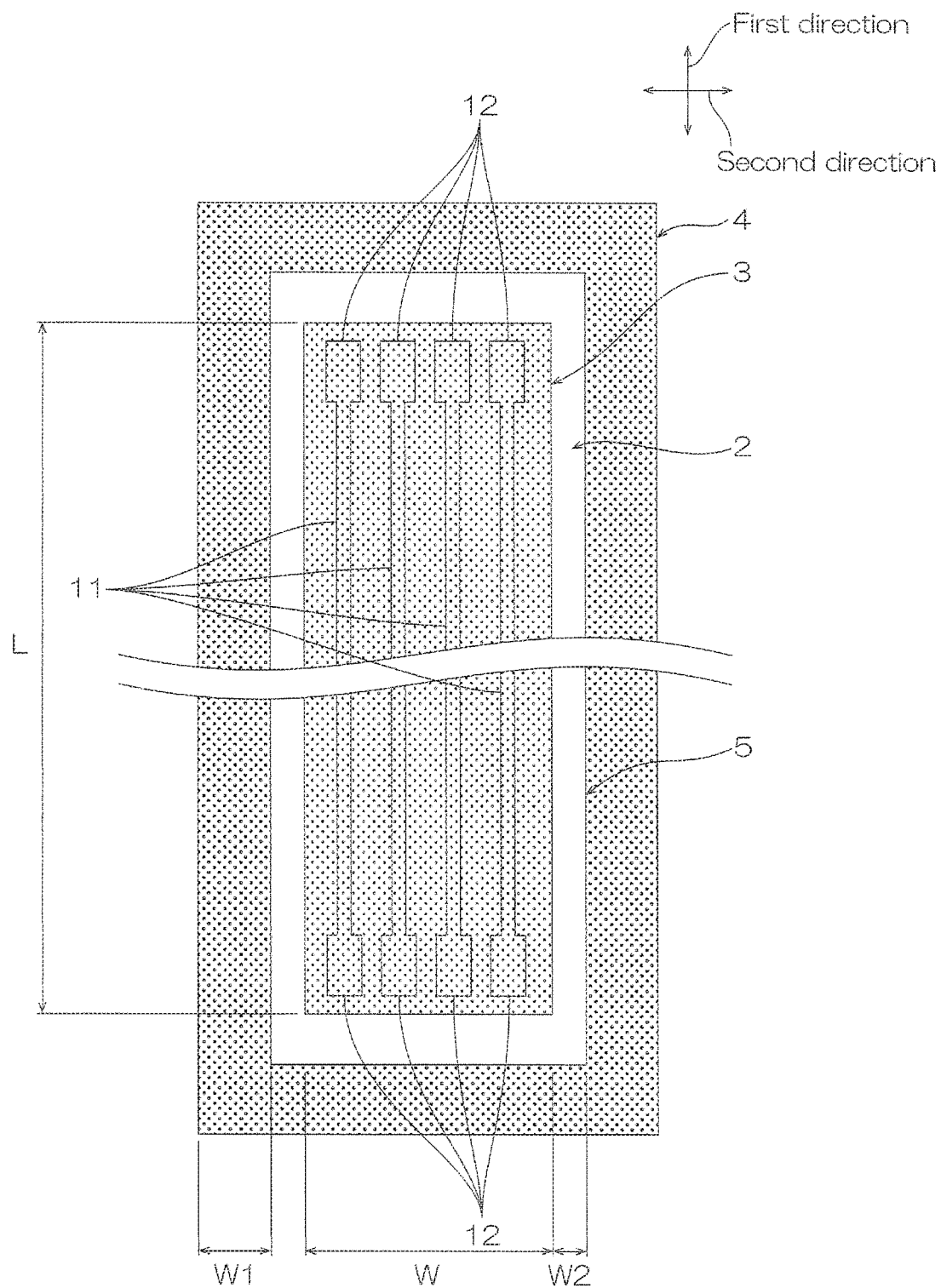
FIG. 1 shows a plan view of a first embodiment of a pressure-sensitive adhesive sheet-including wiring circuit board of the present invention.

A first embodiment of a pressure-sensitive adhesive sheet-including wiring circuit board of the present invention is described in order with reference to FIGS. 1 to 4B. In FIG. 1, in order to clearly show the shape of a conductive layer 9 (described later), a cover insulating layer 10 (described later) is omitted. Further, in order to clearly show the relative arrangement of a wiring circuit board 3 (described later) and a reinforcement substrate 4 (described later), a reinforcement conductive layer 14 (described later) is omitted.

As shown in FIGS. 1 and 2E, a pressure-sensitive adhesive sheet-including wiring circuit board 1 has a predetermined thickness, and has a generally sheet shape (including a plate shape) extending in a plane direction perpendicular to a thickness direction. Specifically, the pressure-sensitive adhesive sheet-including wiring circuit board 1 has a generally rectangular shape when viewed from the top in which a length in a first direction included in the plane direction is long, and a length in a second direction included in the plane direction and perpendicular to the first direction is short.

The pressure-sensitive adhesive sheet-including wiring circuit board 1 includes a pressure-sensitive adhesive sheet 2, the wiring circuit board 3, and the reinforcement substrate 4.

The pressure-sensitive adhesive sheet 2 has a predetermined thickness, and has the same shape as the pressure-sensitive adhesive sheet-including wiring circuit board 1 when viewed from the top. Further, the pressure-sensitive adhesive sheet 2 has flexibility, and thus, it may be wound together with the wiring circuit board 3 and the reinforcement substrate 4. The pressure-sensitive adhesive sheet 2 includes the wiring circuit board 3 and the reinforcement substrate 4 when viewed from the top. The pressure-sensitive adhesive sheet 2 is continuous in the plane direction.

The pressure-sensitive adhesive sheet 2 has, for example, a support substrate (not shown) and a pressure-sensitive adhesive layer (not shown) disposed on a one-side surface in the thickness direction thereof. Examples of the support substrate include a metal and a resin. As the pressure-sensitive adhesive layer, it is formed from a known pressure-sensitive adhesive (pressure-sensitive adhesive agent) into a thin layer. Thus, at least the one-side surface in the thickness direction of the pressure-sensitive adhesive sheet 2 has pressure-sensitive adhesive properties (fine tackiness). A thickness of the pressure-sensitive adhesive sheet 2 is not particularly limited, and is, for example, 10 μm or more, preferably 20 μm or more, and for example, 200 μm or less, preferably 150 μm or less.

A pressure-sensitive adhesive force (90 degree peeling adhesive force) at 25° C. of the pressure-sensitive adhesive sheet 2 with respect to a polyimide plate is, for example, 0.05 (N/20 mm) or more, preferably 0.1 (N/20 mm) or more, and for example, 1 (N/20 mm) or less, preferably 0.5 (N/20 mm) or less. When the pressure-sensitive adhesive force of the pressure-sensitive adhesive sheet 2 is the above-described lower limit or more, the pressure-sensitive adhesive sheet 2 can reliably pressure-sensitively adhere to the wiring circuit board 3 and the reinforcement substrate 4. When the pressure-sensitive adhesive force of the pressure-sensitive adhesive sheet 2 is the above-described upper limit or less, the wiring circuit board 3 can be easily peeled from the pressure-sensitive adhesive sheet 2.

The wiring circuit board 3 has flexibility. The wiring circuit board 3 is included in the pressure-sensitive adhesive sheet 2 when viewed from the top. Specifically, the wiring circuit board 3 is disposed in an intermediate portion in the first direction and an intermediate portion in the second direction of the pressure-sensitive adhesive sheet 2 when viewed from the top. The wiring circuit board 3 has a predetermined thickness, and has a generally rectangular shape when viewed from the top in which a length in the first direction is long and a length in the second direction is short. The wiring circuit board 3 has both end surfaces in the first direction, and both end surfaces in the second direction. Specifically, these end surfaces do not include the cut piece (cut end) described above and are flat.

An other-side surface in the thickness direction of the wiring circuit board 3 is in contact with the one-side surface in the thickness direction of the pressure-sensitive adhesive sheet 2. Specifically, the other-side surface in the thickness direction of the wiring circuit board 3 pressure-sensitively adheres to (is in contact with) the one-side surface in the thickness direction of the pressure-sensitive adhesive sheet 2. In other words, the pressure-sensitive adhesive sheet 2 is disposed on the other-side surface in the thickness direction of the wiring circuit board 3 (surface on the other side).

A dimension of the wiring circuit board 3 is not particularly limited, and a length (length in the first direction) L of the wiring circuit board 3 is, for example, 30 mm or more, preferably, 300 mm or more, more preferably, 600 mm or more, further more preferably, 800 mm or more, particularly preferably, 1000 mm or more, and for example, 6000 mm or less, preferably, 4000 mm or less. When the length L of the wiring circuit board 3 is the above-described lower limit or more, it can be mounted on an elongated electronic device.

A width (length in the second direction) W of the wiring circuit board 3 is, for example, 50 mm or less, preferably, 25 mm or less, more preferably, 15 mm or less, and for example, 0.01 mm or more. A ratio (W/L) of the width (length in the second direction) W to the length (length in the first direction) L in the wiring circuit board 3 is, for example, 0.03 or less, preferably, 0.01 or less, more preferably, 0.005 or less, and for example, 0.00002 or more. When the width W is the above-described upper limit or less, it is possible to dispose the wiring circuit board 3 in a narrow region. When the ratio (W/L) of the width is the above-described upper limit or less, the wiring circuit board 3 can be mounted on an elongated electronic device and in a narrow interior.

The wiring circuit board 3 includes a base insulating layer 8, the conductive layer 9, and the cover insulating layer 10. The wiring circuit board 3 preferably does not include an optical waveguide, and includes only the base insulating layer 8, the conductive layer 9, and the cover insulating layer 10.

The base insulating layer 8 has the same shape as the wiring circuit board 3 when viewed from the top. The base insulating layer 8 forms the other-side surface in the thickness direction of the wiring circuit board 3. An example of a material for the base insulating layer 8 includes a resin having insulating properties such as polyimide. A thickness of the base insulating layer 8 is, for example, 3 μm or more and 50 μm or less.

The conductive layer 9 is disposed on the one-side surface in the thickness direction of the base insulating layer 8. The conductive layer 9 integrally includes a plurality of wires 11 extending in the first direction and a plurality of terminals 12 continuous to both end portions in the first direction of the plurality of wires 11. An example of a material for the conductive layer 9 includes a conductor such as copper. A thickness of the conductive layer 9 is, for example, 5 μm or more and 100 μm or less.

The cover insulating layer 10 is disposed on the one-side surface the thickness direction of the base insulating layer 8 so as to cover the wires 11 and expose the terminals 12. In the cover insulating layer 10, a portion covering the wires 11 forms the one-side surface in the thickness direction of the wiring circuit board 3. An example of a material for the cover insulating layer 10 includes a resin having insulating properties such as polyimide. A thickness of the cover insulating layer 10 is, for example, 1 μm or more and 30 μm or less.

The reinforcement substrate 4 is included in the pressure-sensitive adhesive sheet 2 when viewed from the top, and is disposed around the wiring circuit board 3 at intervals thereto. Further, the reinforcement substrate 4 is continuous along a peripheral direction of the wiring circuit board 3, and specifically, has a generally rectangular frame shape when viewed from the top. The pressure-sensitive adhesive sheet 2 is disposed on the other-side surface in the thickness direction of the reinforcement substrate 4 that is the same side as the other-side surface in the thickness direction of the wiring circuit board 3. In short, the other-side surface in the thickness direction of the reinforcement substrate 4 pressure-sensitively adheres to (is in contact with) the one-side surface in the thickness direction of the pressure-sensitive adhesive sheet 2.

The reinforcement substrate 4 includes a reinforcement base layer 13, the reinforcement conductive layer 14, and a reinforcement cover layer 15. Each of the reinforcement base layer 13, the reinforcement conductive layer 14, and the reinforcement cover layer 15 is formed as the same layer as each of the base insulating layer 8, the conductive layer 9, and the cover insulating layer 10 described above of the wiring circuit board 3.

Specifically, the reinforcement base layer 13 forms the other-side surface in the thickness direction of the reinforcement substrate 4. The reinforcement base layer 13 has the same shape as the reinforcement substrate 4 when viewed from the top. A material and a thickness of the reinforcement base layer 13 are the same as those of the base insulating layer 8.

The reinforcement conductive layer 14 is included in the reinforcement base layer 13 when viewed from the top. Specifically, the reinforcement conductive layer 14 has a narrower belt shape than the reinforcement base layer 13 when viewed from the top. The reinforcement conductive layer 14 is disposed on the one-side surface in the thickness direction of the reinforcement base layer 13. A material and a thickness of the reinforcement conductive layer 14 are the same as those of the conductive layer 9.

The reinforcement cover layer 15 is disposed on the one-side surface in the thickness direction of the reinforcement conductive layer 14 and the side surfaces and a portion that is not overlapped with the reinforcement conductive layer 14 in the one-side surface in the thickness direction of the reinforcement base layer 13. The reinforcement cover layer 15 forms the one-side surface in the thickness direction of the reinforcement substrate 4. A material and a thickness of the reinforcement cover layer 15 are the same as those of the cover insulating layer 10.

A width W1 of the reinforcement substrate 4 is a distance between the inner peripheral surface and the outer peripheral surface of the reinforcement substrate 4, and specifically, is, for example, 0.1 mm or more, preferably 0.5 mm or more, and for example, 50 mm or less, preferably 30 mm or less.

In the pressure-sensitive adhesive sheet 2, a region between the wiring circuit board 3 and the reinforcement substrate 4 is partitioned as an isolation region 5 when viewed from the top. The isolation region 5 separates the wiring circuit board 3 from the reinforcement substrate 4. In the isolation region 5, the wiring circuit board 3 and the reinforcement substrate 4 are not disposed. The outer peripheral surface of the wiring circuit board 3 and the inner peripheral surface of the reinforcement substrate 4 face the isolation region 5. Further, the one-side surface in the thickness direction of the pressure-sensitive adhesive sheet 2 corresponding to the isolation region 5 is exposed from the isolation region 5 toward one side in the thickness direction.

A width W2 of the isolation region 5 is a distance between the outer peripheral surface of the wiring circuit board 3 and the inner peripheral surface of the reinforcement substrate 4, and specifically, is, for example, 10 μm or more, preferably 20 μm or more, and for example, 2000 μm or less, preferably 1000 μm or less. When the width W2 of the isolation region 5 is the above-described lower limit or more, the wiring circuit board 3 can be smoothly peeled from the pressure-sensitive adhesive sheet 2. When the width W2 of the isolation region 5 is the above-described upper limit or less, it is possible to reliably reinforce the pressure-sensitive adhesive sheet 2 at the time of peeling the wiring circuit board 3 from the pressure-sensitive adhesive sheet 2.

Next, a method for producing the first embodiment of the pressure-sensitive adhesive sheet-including wiring circuit board 1 is described. The method includes the first to the fifth steps (ref: FIGS. 2A to 2E). In this method, the first to the fifth steps are carried out in order.

[First Step]

In the first step, as shown in FIG. 2A, the base insulating layer 8, the conductive layer 9, and the cover insulating layer 10 are formed in order on the one-side surface in the thickness direction of a support sheet 17 toward one side the thickness direction. In addition, the reinforcement base layer 13, the reinforcement conductive layer 14, and the reinforcement cover layer 15 are formed in order toward one side in the thickness direction. Thus, the wiring circuit board 3 and the reinforcement substrate 4 are produced on the one-side surface in the thickness direction of the support sheet 17 at the same time.

First, as shown in FIG. 3A, the support sheet 17 is prepared. The support sheet 17 is not particularly limited as long as it can support (ensure) the pressure-sensitive adhesive sheet 2 and the wiring circuit board 3 from the other side in the thickness direction. An example thereof includes a sheet having toughness, flexibility, rigidity, and the like. Examples of the support sheet 17 include a metal plate such as a stainless steel plate, a resin sheet (including a photosensitive resin sheet) such as a polyimide sheet (non-pressure-sensitive adhesive sheet), and paper. As the support sheet 17, from the viewpoint of ensuring excellent toughness and excellent rigidity, preferably a metal sheet is used, more preferably, a stainless steel sheet is used. Further, the support sheet 17 is a single layer or multilayers (laminate). A thickness of the support sheet 17 is not particularly limited, and is, for example, 5 μm or more, preferably 15 μm or more, and for example, 5000 μm or less, preferably 500 μm or less.

Subsequently, as shown in FIG. 3B, a varnish of a photosensitive resin is applied to the one-side surface in the thickness direction of the support sheet 17, and the base insulating layer 8 and the reinforcement base layer 13 are formed at the same time by photolithography. Then, as shown in FIG. 3C, each of the conductive layer 9 and the reinforcement conductive layer 14 is formed on each of the one-side surfaces in the thickness direction of the base insulating layer 8 and the reinforcement base layer 13 by an additive method, a subtractive method, or the like. Thereafter, the varnish of the photosensitive resin is applied to the one-side surfaces in the thickness direction of the conductive layer 9 and the reinforcement base layer 13, the one-side surface in the thickness direction exposed from the conductive layer 9 in the base insulating layer 8, the one-side surface in the thickness direction exposed from the reinforcement conductive layer 14 in the reinforcement base layer 13, and the one-side surface in the thickness direction exposed from the base insulating layer 8 and the reinforcement base layer 13 in the support sheet 17 and as shown in FIG. 2A, the cover insulating layer 10 and the reinforcement cover layer 15 are formed at the same time by photolithography.

Thus, in the first step, the wiring circuit board 3 and the reinforcement substrate 4 are formed on the one-side surface in the thickness direction of the support sheet 17 at the same time.

[Second Step]

In the second step, as shown in FIG. 2B, a second support sheet 18 is brought into contact with the one-side surfaces in the thickness direction of the wiring circuit board 3 and the reinforcement substrate 4.

As shown in FIG. 2A, the second support sheet 18 is not particularly limited as long as it can support (ensure) the wiring circuit board 3 and the reinforcement substrate 4 from one side in the thickness direction. For example, the same sheet (plate) as the support sheet 17 is used. As the second support sheet 18, preferably, a resin sheet is used, more preferably, a resin sheet for a resist is used, further more preferably, from the viewpoint of easily removing the second support sheet 18 in the fifth step (ref: FIG. 2F), a photosensitive resin sheet is used, particularly preferably, a photosensitive dry film resist (specifically, a photosensitive dry film resist prior to photosensitization) is used.

As shown in FIG. 2B, when the second support sheet 18 is a resin sheet having flexibility and followability, in the second step, the second support sheet 18 is in contact with the peripheral side surfaces of the wiring circuit board 3 and the reinforcement substrate 4, and the one-side surface in the thickness direction around the wiring circuit board 3 and the reinforcement substrate 4 in the support sheet 17.

[Third Step]

In the third step, as showing in FIG. 2C, the support sheet 17 is removed. The method of removing the support sheet 17 is not particularly limited, and examples thereof include peeling and etching. By removing the support sheet 17, the other-side surface in the thickness direction of the wiring circuit board 3, the other-side surface in the thickness direction of the reinforcement substrate 4, and the other-side surface in the thickness direction of the second support sheet 18 around the wiring circuit board 3 are exposed toward the other side in the thickness direction. The other-side surfaces in the thickness direction of the wiring circuit board 3 and the reinforcement substrate 4 are, for example, flush with the other-side surface in the thickness direction of the second support sheet 18.

The wiring circuit board 3 and the reinforcement substrate 4 are spaced apart from each other when viewed from the bottom. However, the second support sheet 18 supports them from at least one side in the thickness direction. Preferably, the second support sheet 18 also supports the wiring circuit board 3 and the reinforcement substrate 4 from both sides in the plane direction. Therefore, the wiring circuit board 3 and the reinforcement substrate 4 are not separated from the second support sheet 18. That is, the wiring circuit board 3 and the reinforcement substrate 4 are held by the second support sheet 18

[Fourth Step]

In the fourth step, as shown in FIG. 2D, the pressure-sensitive adhesive sheet 2 pressure-sensitively adheres to the other-side surfaces in the thickness direction of the wiring circuit board 3, the reinforcement substrate 4, and the second support sheet 18. The one-side surface in the thickness direction of the pressure-sensitive adhesive sheet 2 is brought into contact with the other-side surfaces in the thickness direction of the wiring circuit board 3, the reinforcement substrate 4, and the second support sheet 18.

[Fifth Step]

In the fifth step, as shown in FIG. 2E, the second support sheet 18 is removed. As a method of removing the second support sheet 18, peeling, etching (wet etching etc.), and the like are used.

Thus, the wiring circuit board 3 and the reinforcement substrate 4 are obtained in a state of being supported by the one-side surface in the thickness direction of the pressure-sensitive adhesive sheet 2. That is, the pressure-sensitive adhesive sheet-including wiring circuit board 1 including the wiring circuit board 3, the reinforcement substrate 4, and the pressure-sensitive adhesive sheet 2 disposed on the other-side surfaces in the thickness direction of the wiring circuit board 3 and the reinforcement substrate 4 is produced.

The wiring circuit board 3 and the reinforcement substrate 4 are spaced apart from each other when viewed from the top. Since the pressure-sensitive adhesive sheet 2 collectively supports the wiring circuit board 3 and the reinforcement substrate 4 from the other side in the thickness direction, the wiring circuit board 3 and the reinforcement substrate 4 are not separated from the pressure-sensitive adhesive sheet 2.

Thereafter, as shown in FIG. 2F, the wiring circuit board 3 is peeled from the pressure-sensitive adhesive sheet 2. Specifically, as shown by an arrow of FIG. 2F, the wiring circuit board 3 is moved toward one side in the thickness direction with respect to the pressure-sensitive adhesive sheet 2.

The wiring circuit board 3 is mounted on another electronic device. The electronic device is not particularly, limited, and preferably, a catheter is used.

Figure 4A:
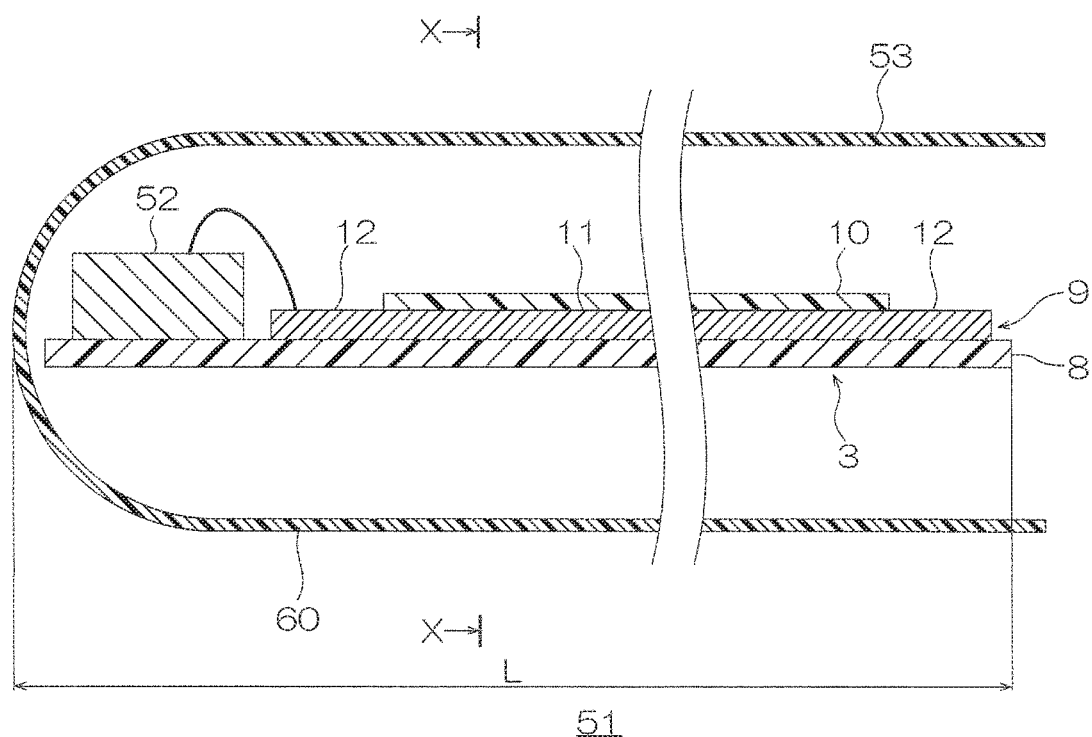
FIGS. 4A to 4B show a catheter including the wiring circuit board shown in FIGS. 1 and 2F.
Figure 4B:
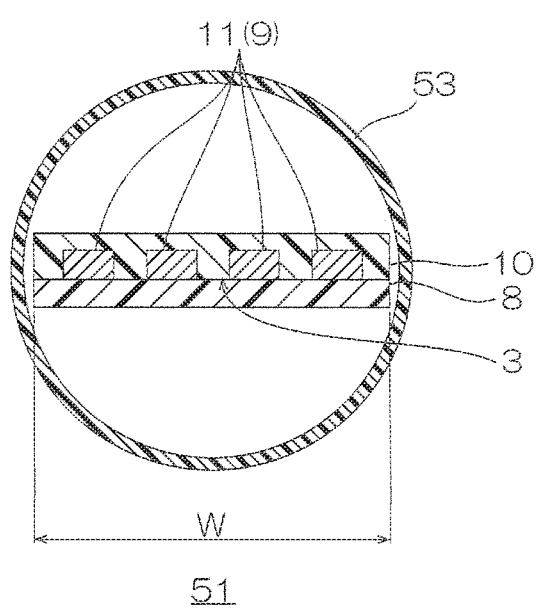

A catheter on which a wiring circuit board is mounted is described with reference to FIGS. 4A to 4B. A catheter 51 includes the wiring circuit board 3, an electronic component 52 which is electrically connected to the terminal 12 of the wiring circuit board 3, and a catheter tube 53 for accommodating them. The catheter tube 53 has an elongated cylindrical shape. Preferably, the catheter tube 53 has a cylindrical shape. When viewed in the cross-sectional view along a direction perpendicular to a longitudinal direction, the maximum distance (preferably, the inner diameter) between the two inner surfaces on a line passing through the center of gravity of the catheter tube 53 is, for example, 50 mm or less, preferably, 30 mm or less, more preferably, 20 mm or less, and for example, 1 mm or more. When the maximum distance is the above-described upper limit or less, the catheter 51 can reduce the load on the human body.

(Function and Effect of First Embodiment)

Then, in the pressure-sensitive adhesive sheet-including wiring circuit board 1, as shown in FIG. 2F, only by peeling the wiring circuit board 3 from the pressure-sensitive adhesive sheet 2, it is possible to obtain the wiring circuit board 3 without having a cut piece (cut end). Therefore, the wiring circuit board 3 can be smoothly mounted in a narrow region.

However, in a case where the wiring circuit board 3 has the length L of 300 mm or more and has the cut piece (cut end) described above, when the wiring circuit board 3 is held by the sheet through the joint portion, since it is inevitable to provide a large number of joint portions, the number of cut piece described above is increased, and therefore, the above-described problem is apparent.

However, in the pressure-sensitive adhesive sheet-including wiring circuit board 1, it is possible to obtain the wiring circuit board 3 without having the cut piece (cut end) described above. Therefore, even the long wiring circuit board 3 can be smoothly mounted in a narrow region.

Since the pressure-sensitive adhesive sheet-including wiring circuit board 1 further includes the reinforcement substrate 4 that is included in the pressure-sensitive adhesive sheet 2 when projected in the thickness direction and is continuous in the plane direction. Thus, it can reinforce the pressure-sensitive adhesive sheet 2 corresponding to the reinforcement substrate 4. Therefore, it is possible to smoothly and reliably peel the wiring circuit board 3 from the pressure-sensitive adhesive sheet 2.

In the pressure-sensitive adhesive sheet-including wiring circuit board 1, since the reinforcement substrate 4 includes the reinforcement conductive layer 14, it can further reinforce the pressure-sensitive adhesive sheet 2 corresponding to the reinforcement substrate 4, and the wiring circuit board 3 can be further more smoothly and reliably peeled from the pressure-sensitive adhesive sheet 2.

In the method for producing the pressure-sensitive adhesive sheet-including wiring circuit board 1, as shown in FIG. 2A, by an easy method in which the wiring circuit board 3 is formed on the one-side surface in the thickness direction of the support sheet 17, next, as shown in FIG. 2B, the second support sheet 18 is brought into contact with the one-side surface in the thickness direction of the wiring circuit board 3, and thereafter, as shown in FIG. 2C, the support sheet 17 is removed, the wiring circuit board 3 without having the cut piece (cut end) described above can be obtained.

Furthermore, as shown in FIG. 2D, the pressure-sensitive adhesive sheet 2 pressure-sensitively adheres to the other-side surface in the thickness direction of the wiring circuit board 3, and thereafter, as shown in FIG. 2E, the second support sheet 18 is removed. Therefore, when the wiring circuit board 3 is peeled from the pressure-sensitive adhesive sheet 2, it is possible to easily obtain the wiring circuit board 3 without having the cut piece (cut end) described above.

However, in a case where the wiring circuit board 3 has the length L of 300 mm or more, the number of cut piece described above is increased, and therefore, labor for cutting the pieces is significantly increased.

However, in the method for producing the pressure-sensitive adhesive sheet-including wiring circuit board 1, since the wiring circuit board 3 without having the cut piece (cut end) described above is obtained, even the wiring circuit board 3 having the length L of 300 mm or more can be produced by separating the wiring circuit board 3 from the pressure-sensitive adhesive sheet 2 by an easy method of peeling the wiring circuit board 3 from the pressure-sensitive adhesive sheet 2.

In the second step of this method, as shown in FIG. 28, since the second support sheet 18 is brought into contact with the one-side surface of the reinforcement substrate 4, thereafter, as shown in FIG. 2C, in the third step, even when the support sheet 17 is removed, the second support sheet 18 in which the periphery of the wiring circuit board 3 is reinforced by the reinforcement substrate 4 can reliably support the wiring circuit board 3.

In this method, in the second step shown in FIG. 2B, when the second support sheet 18 has flexibility and followability, since both side surfaces of the wiring circuit board 3 are covered with the second support sheet 18, the peripheral side surfaces of the terminal 12 exposed from the cover insulating layer 10 (not shown in FIG. 2B) can be also covered. Therefore, in the third step shown in FIG. 2C, even when a peeling solution or an etching solution is used, it is possible to protect the peripheral side surfaces of the terminal 12 from the peeling solution and the etching solution. Therefore, the wiring circuit board 3 is excellent in reliability.

Modified Examples

In the following each of the modified examples, the same reference numerals are provided for members and steps corresponding to each of those in the above-described first embodiment, and their detailed description is omitted. Each of the modified examples can achieve the same function and effect as that of the first embodiment unless otherwise specified. Furthermore, the first embodiment and the modified examples thereof can be appropriately used in combination.

Figure 5A:
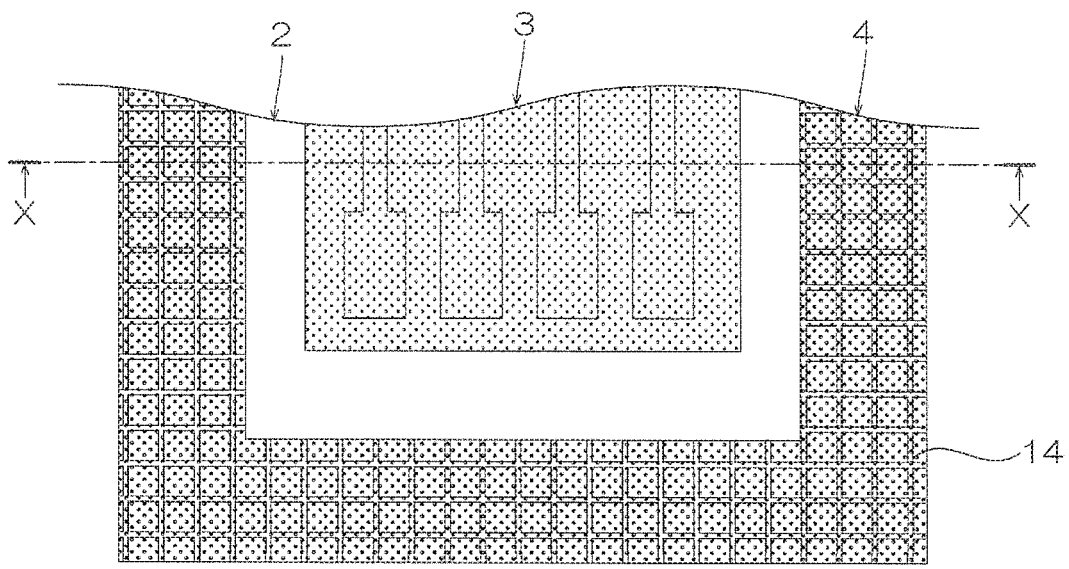
FIGS. 5A to 5B show a modified example (embodiment in which a reinforcement conductive layer has a generally lattice shape when viewed from the top) of the pressure-sensitive adhesive sheet-including wiring circuit board shown in FIG. 1.
Figure 5B:
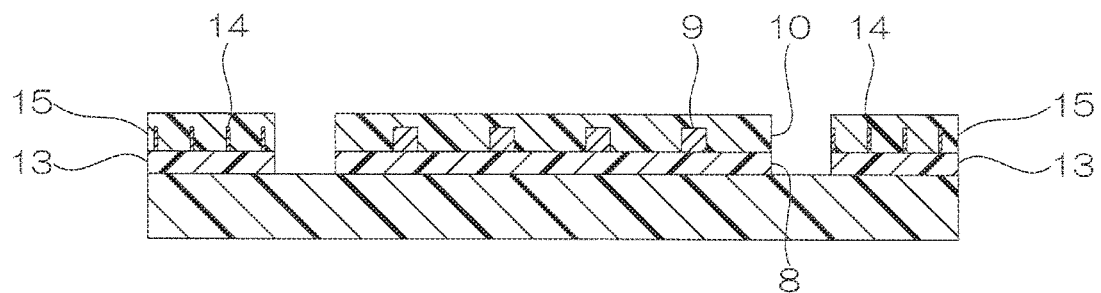

As shown in FIGS. 5A to 5B, the reinforcement conductive layer 14 has a generally lattice shape when viewed from the top. Therefore, it is possible to uniformly reinforce the pressure-sensitive adhesive sheet 2 corresponding to the reinforcement substrate 4, while the material cost is reduced.

A shape of the reinforcement conductive layer 14 when viewed from the top is not limited to the description above, and though not shown, examples thereof include a honeycomb shape, a triangular shape, and a dot shape.

The pressure-sensitive adhesive sheet-including wiring circuit board 1 includes the one wiring circuit board 3.

Figure 6:
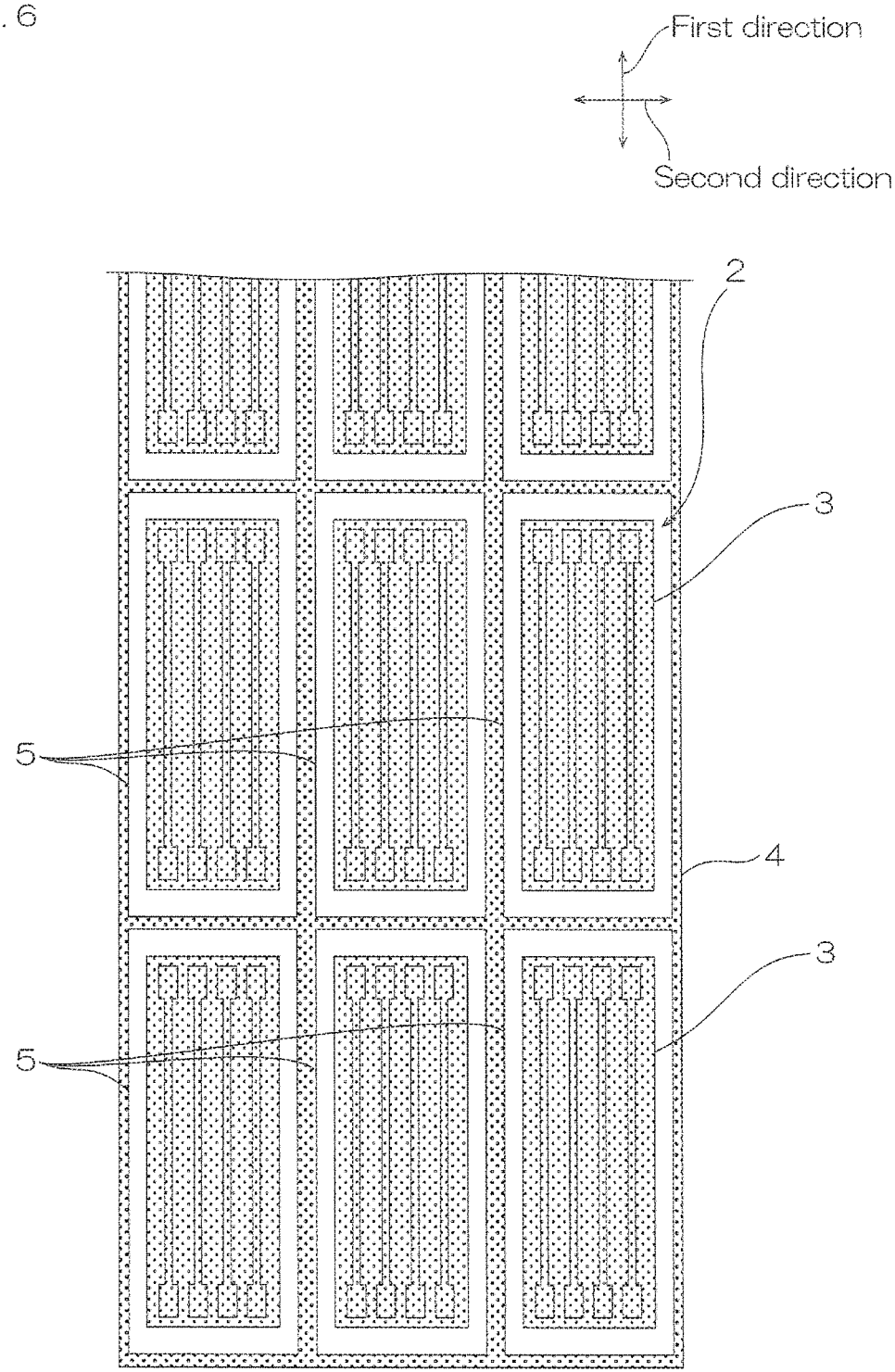
FIG. 6 shows a plan view of a modified example (embodiment in which the pressure-sensitive adhesive sheet-including wiring circuit board includes the plurality of wiring circuit boards) of the pressure-sensitive adhesive sheet-including wiring circuit board shown in FIG. 1.

Alternatively, for example, as shown in FIG. 6, the pressure-sensitive adhesive sheet-including wiring circuit board 1 can also include the plurality of wiring circuit boards 3.

As shown in FIG. 6, the plurality of wiring circuit boards 3 are spaced apart from each other in the first direction and the second direction. The reinforcement substrate 4 is continuously disposed around each of the plurality of wiring circuit boards 3. Specifically, the reinforcement substrate 4 has a generally lattice shape when viewed from the top.

In the third step of the first embodiment, as shown in FIG. 2C, the entire support sheet 17 is removed. In the modified example, though not shown, only a portion corresponding to the wiring circuit board 3 in the support sheet 17 is removed. Specifically, in the modified example, in the support sheet 17, a portion corresponding to the reinforcement substrate 4 and the isolation region 5 is left, and a portion corresponding to the wiring circuit board 3 is removed. That is, in the present invention, in the third step, it is sufficient to remove a portion corresponding to at least the wiring circuit board 3 in the support sheet 17.

The reinforcement substrate 4 includes the reinforcement base layer 13, the reinforcement conductive layer 14, and the reinforcement cover layer 15. Alternatively, any one or any two of the three layers may be also included. Preferably, one to three layers including at least the reinforcement conductive layer 14 are included. Specifically, as the reinforcement substrate 4, one layer of only the reinforcement conductive layer 14, two layers of the reinforcement conductive layer 14 and the reinforcement base layer 13, two layers of the reinforcement conductive layer 14 and the reinforcement cover layer 15, and three layers of the reinforcement base layer 13, the reinforcement conductive layer 14, and the reinforcement cover layer 15 are included. When the reinforcement substrate 4 includes at least the reinforcement conductive layer 14, the pressure-sensitive adhesive sheet 2 corresponding to the reinforcement substrate 4 can be further reinforced, and the wiring circuit board 3 can be further more smoothly and reliably peeled from the pressure-sensitive adhesive sheet 2.

Further, though not shown, the pressure-sensitive adhesive sheet-including wiring circuit board 1 may not include the reinforcement substrate 4. Preferably, as in the first embodiment, the pressure-sensitive adhesive sheet-including wiring circuit board 1 includes the reinforcement substrate 4. In the first embodiment, it is possible to reinforce the pressure-sensitive adhesive sheet 2 corresponding to the reinforcement substrate 4. Therefore, the wiring circuit board 3 can be smoothly and reliably peeled from the pressure-sensitive adhesive sheet 2.

Second Embodiment

In the second embodiment, the same reference numerals are provided for members and steps corresponding to each of those in the first embodiment and the modified examples thereof described above, and their detailed description is omitted. The second embodiment can achieve the same function and effect as that of the first embodiment and the modified examples thereof unless otherwise specified. Furthermore, the first embodiment, the modified examples thereof, and the second embodiment can be appropriately used in combination.

Figure 7A:
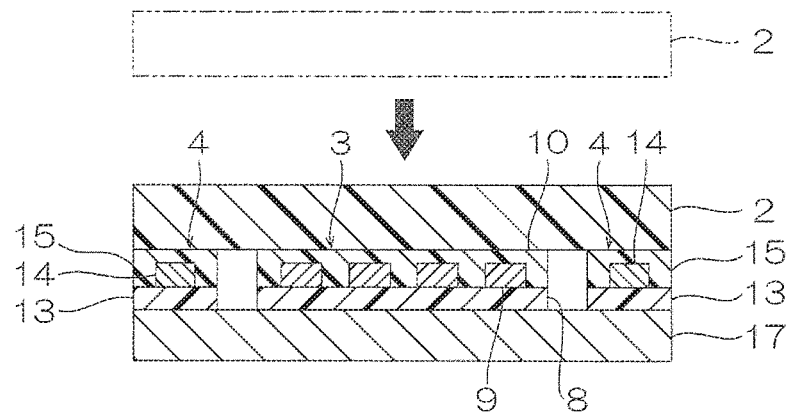
FIGS. 7A to 7C show cross-sectional views for illustrating a production process of a second embodiment of the present invention.
Figure 7B:
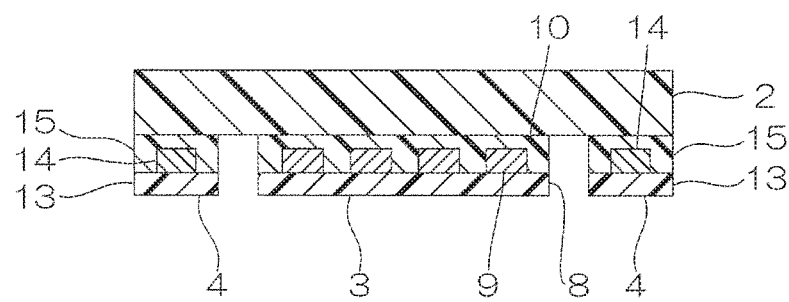

In the second embodiment, as shown in FIGS. 7A to 7B, the fourth step to the fifth step of the first embodiment are not carried out, while the pressure-sensitive adhesive sheet 2 is used as the second support sheet 18, and the first step to the third step are carried out in order

[First Step]

In the first step, as shown in FIG. 2A, in the second embodiment, in the first step, the base insulating layer 8, the conductive layer 9, and the cover insulating layer 10 are formed in order on the one-side surface in the thickness direction of the support sheet 17 toward one side in the thickness direction in the same manner as the first embodiment. In addition, the reinforcement base layer 13, the reinforcement conductive layer 14, and the reinforcement cover layer 15 are formed in order on the one-side surface in the thickness direction of the support sheet 17 toward one side in the thickness direction. Thus, the wiring circuit board 3 and the reinforcement substrate 4 are produced on the one-side surface in the thickness direction of the support sheet 17 at the same time.

[Second Step]

In the second step, as shown by the arrow of FIG. 7A, the pressure-sensitive adhesive sheet 2 is brought into contact with the one-side surfaces in the thickness direction of the wiring circuit board 3 and the reinforcement substrate 4. Specifically, the other-side surface in the thickness direction of the pressure-sensitive adhesive sheet 2 pressure-sensitively adheres to the one-side surfaces in the thickness direction of the wiring circuit board 3 and the reinforcement substrate 4

[Third Step]

In the third step, as shown in FIG. 7B, the support sheet 17 is removed.

Thus, the wiring circuit board 3, the reinforcement substrate 4, and the pressure-sensitive adhesive sheet 2 in which the one-side surfaces in the thickness direction of the wiring circuit board 3 and the reinforcement substrate 4 are disposed are prepared.

Figure 7C:
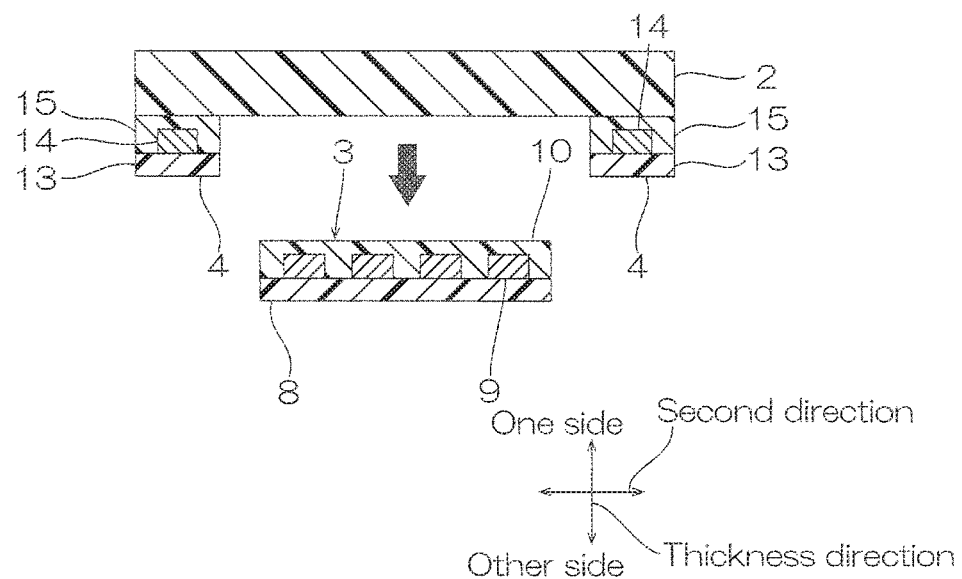

Thereafter, as shown in FIG. 7C, the wiring circuit board 3 is peeled from the pressure-sensitive adhesive sheet 2. Specifically, as shown by the arrow of FIG. 7C, the wiring circuit board 3 is moved toward the other side in the thickness direction with respect to the pressure-sensitive adhesive sheet 2.

(Function and Effect of Second Embodiment)

In the second embodiment, as shown in FIG. 7A, the pressure-sensitive adhesive sheet 2 pressure-sensitively adheres to the other-side surface in the thickness direction of the wiring circuit board 3, and then, as shown in FIG. 7B, the support sheet 17 is removed. Therefore, by separating the wiring circuit board 3 from the pressure-sensitive adhesive sheet 2, it is possible to easily obtain the wiring circuit board 3 without having the cut piece (cut end) described above. Further, since the fourth step and the fifth step are not carried out, it is possible to reduce the number of steps. Furthermore, since the second support sheet 18 is not used, it is possible to reduce the production cost.

On the other hand, in the second embodiment, as shown in FIG. 7, the pressure-sensitive adhesive sheet 2 pressure-sensitively adheres to the one-side surface in the thickness direction of the wiring circuit board 3. Therefore, when the wiring circuit board 3 is peeled from the pressure-sensitive adhesive sheet 2, glue is left on the one-side surface in the thickness direction of the terminal 12 (not shown in FIG. 7B), and therefore, there may be a case where the electrical connection reliability at the terminal 12 is reduced. On the other hand, in the first embodiment, as shown in FIG. 2E, the pressure-sensitive adhesive sheet 2 pressure-sensitively adheres to the other-side surface m the thickness direction of the wiring circuit board 3. Therefore, even when glue is left on the other-side surface in the thickness direction of the base insulating layer 8 at the time of peeling the wiring circuit board 3 from the pressure-sensitive adhesive sheet 2, it is possible to suppress a decrease in the connection reliability described above at the terminal 12 (not shown in FIG. 2E).

Third Embodiment

In the third embodiment, the same reference numerals are provided for members and steps corresponding to each of those in the first embodiment, the modified examples thereof, and the second embodiment described above, and their detailed description is omitted. The third embodiment can achieve the same function and effect as that of the first embodiment, the modified examples thereof, and the second embodiment unless otherwise specified. Furthermore, the first embodiment, the modified examples thereof, the second embodiment, and the third embodiment can be appropriately used in combination.

Figure 9E:
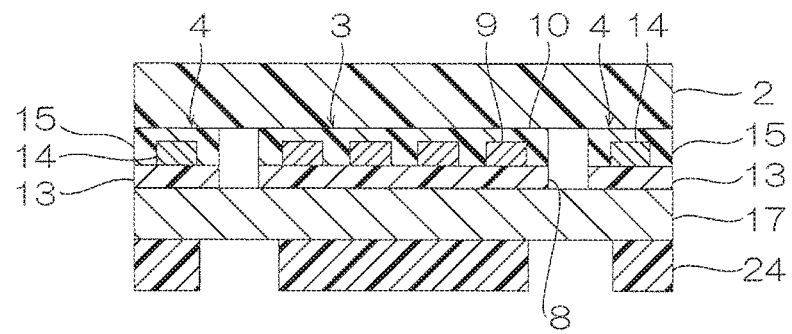
FIGS. 9E to 9H, subsequent to FIG. XD, show cross-sectional views for illustrating a production process of the third embodiment of the present invention.
Figure 9F:
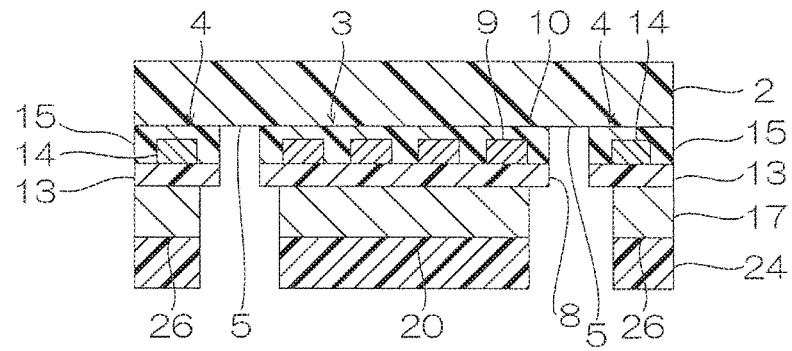
Figure 9G:
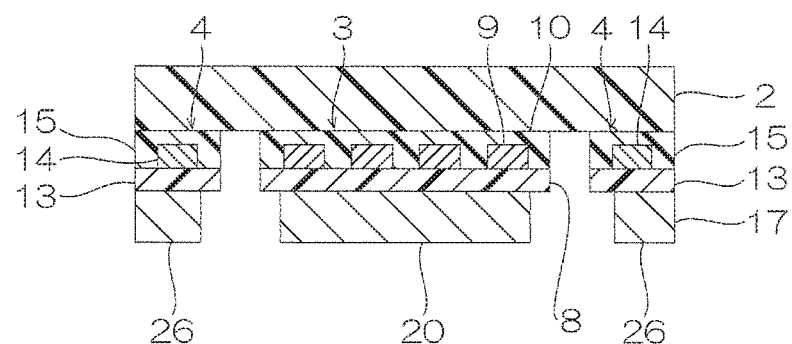
Figure 9H:
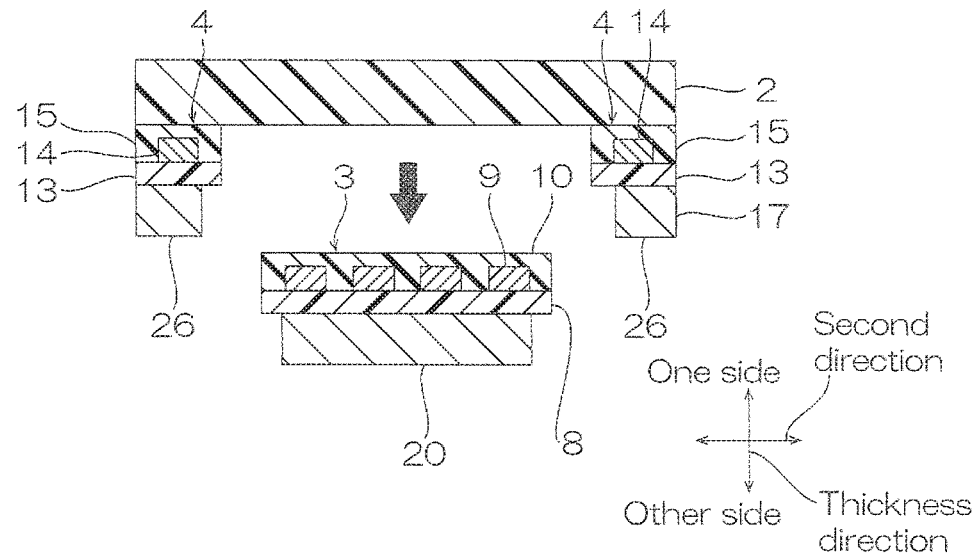

As shown in FIG. 9H, the wiring circuit board 3 is a metal support layer-including wiring circuit board that further includes a metal support layer 20. The wiring circuit board 3 includes the metal support layer 20, the base insulating layer 8, the conductive layer 9, and the cover insulating layer 10. The wiring circuit board 3 preferably does not include an optical waveguide, and includes only the metal support layer 20, the base insulating layer 8, the conductive layer 9, and the cover insulating layer 10.

The metal support layer 20 is disposed on the other-side surface in the thickness direction of the base insulating layer 8. The metal support layer 20 is included in the base insulating layer 8 when viewed from the bottom, and is smaller than the base insulating layer 8. Therefore, the metal support layer 20 exposes the peripheral end portion of the other-side surface in the thickness direction of the base insulating layer 8. The metal support layer 20 forms the other-side surface in the thickness direction of the wiring circuit board 3. An example of a material for the metal support layer 20 includes a metal, and from the viewpoint of ensuring excellent toughness, stainless steel is preferably used. A thickness of the metal support layer 20 is, for example, 5 μm or more and 100 μm or less.

The reinforcement substrate 4 further includes a reinforcement metal support layer 26. The reinforcement substrate 4 includes the reinforcement metal support layer 26, the reinforcement base layer 13, the reinforcement conductive layer 14, and the reinforcement cover layer 15.

The reinforcement metal support layer 26 is included in the reinforcement base layer 13 when viewed from the top. The reinforcement metal support layer 26 forms the other-side surface in the thickness direction of the reinforcement substrate 4. The inner end surface facing the metal support layer 20 in the reinforcement metal support layer 26 is disposed outside from the inner end surface facing the base insulating layer 8 in the reinforcement base layer 13 when projected in the thickness direction. The reinforcement metal support layer 26 is formed as the same layer as the metal support layer 20.

A method for producing the pressure-sensitive adhesive sheet-including wiring circuit board 1 including the metal support layer 20 and the reinforcement metal support layer 26 is described with reference to FIGS. 2A and 8A to 9H.

In this method, the first step to the third step are carried out in order.

[First Step]

In the first step, as shown in FIG. 2A, the base insulating layer 8, the conductive layer 9, and the cover insulating layer 10 are formed in order on the one-side surface in the thickness direction of the support sheet 17 toward one side in the thickness direction in the same manner as the first step of the first embodiment. At the same time, the reinforcement base layer 13, the reinforcement conductive layer 14, and the reinforcement cover layer 15 are formed in order on the one-side surface in the thickness direction of the support sheet 17 toward one side in the thickness direction. Thus, the wiring circuit board 3 and the reinforcement substrate 4 are produced on the one-side surface in the thickness direction of the support sheet 17.

In the first step, the support sheet 17 is preferably a metal plate, more preferably a stainless steel plate. The support sheet 17 is a metal sheet for forming the metal support layer 20 and the reinforcement metal support layer 26.

[Second Step]

Figure 8A:
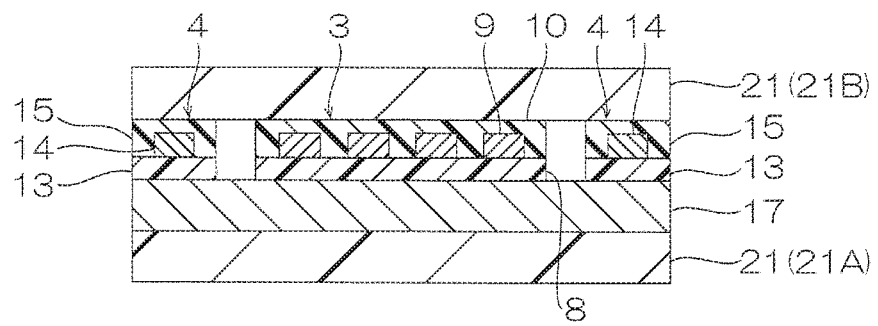
FIGS. 8A to 8D show cross-sectional views for illustrating a production process of a third embodiment of the present invention.
Figure 8B:
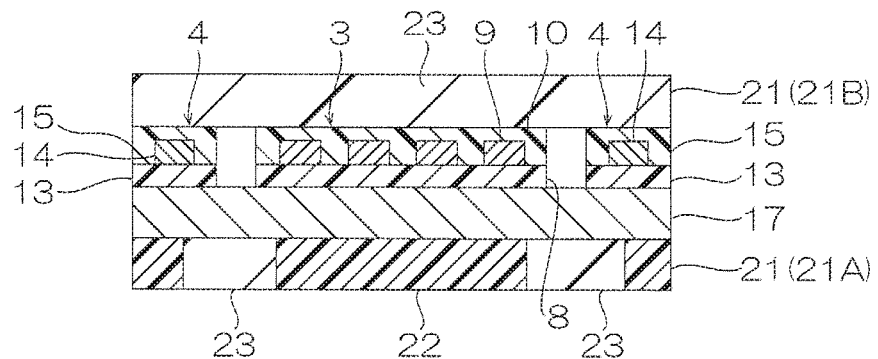
Figure 8C:
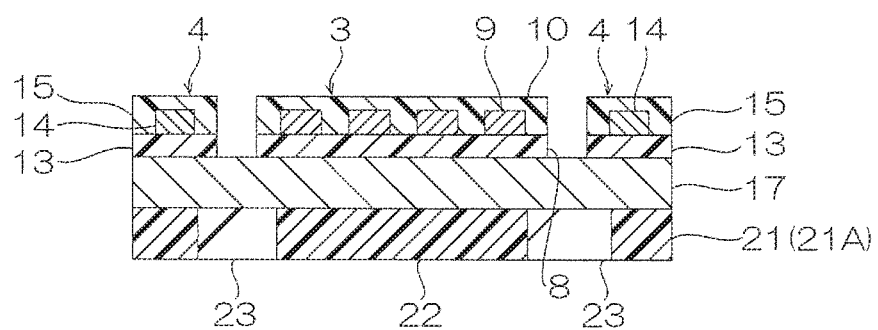
Figure 8D:
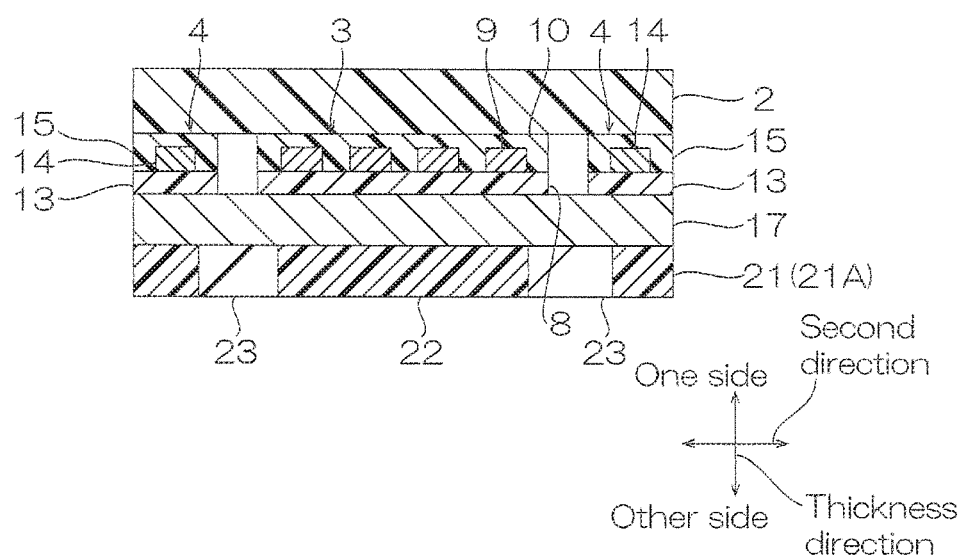

In the second step, as shown in FIG. 8D, the pressure-sensitive adhesive sheet 2 is brought into contact with the one-side surfaces in the thickness direction of the wiring circuit board 3 and the reinforcement substrate 4 in the same manner as the second step of the second embodiment.

[Third Step]

In the third step, as shown in FIG. 9F, a portion around the wiring circuit board 3 in the support sheet 17 is removed. Thus, the isolation region 5 of the support sheet 17 is exposed toward the other side in the thickness direction. For example, the support sheet 17 is etched by using an etching resist 24 (ref: FIG. 9E). The etching resist 24 has the same pattern as the metal support layer 20 and the reinforcement metal support layer 26. The etching resist 24 is formed by photolithography of a photoresist 21.

To form the etching resist 24, for example, first, as shown in FIG. 8A, each of the two photoresists 21 is disposed in each of the support sheet 17, the wiring circuit board 3, and the reinforcement substrate 4 after the first step and before the second step. Specifically, a first photoresist 21A is disposed on the other-side surface in the thickness direction of the support sheet 17. A second photoresist 21B is disposed on the one-side surfaces in the thickness direction of the wiring circuit board 3 and the reinforcement substrate 4.

Thereafter, as shown in FIG. 8B, by exposing the first photoresist 21A through a photomask that is not shown, a latent image consisting of a portion to be left 22 and a portion to be removed 23 is formed by photolithography. On the other hand, the second photoresist 21B is not exposed. Therefore, the second photoresist 21B becomes the portion to be removed 23, when the photoresist 21 is a negative type, the portion to be left 22 is an exposed portion, and the portion to be removed 23 is an unexposed portion.

Subsequently, as shown in FIG. 8C, only the second photoresist 218 is removed by development. Specifically, the first photoresist 21A is left without development, and the second photoresist 21B is removed by development. Thereafter, in the third step, as shown in FIG. 8D, the pressure-sensitive adhesive sheet 2 is disposed on the one-side surfaces in the thickness direction of the wiring circuit board 3 and the reinforcement substrate 4 on which the second photoresist 21B is disposed.

After the third step, as shown in FIG. 9E, the first photoresist 21A is developed to form the etching resist 24. In the development of the first photoresist 21A, the portion to be removed 23 is removed, and the portion to be left 22 is left to become the etching resist 24.

Thereafter, as shown in FIG. 9F, the support sheet 17 exposed from the etching resist 24 is etched to form the metal support layer 20 and the reinforcement metal support layer 26.

Thus, the wiring circuit board 3 and the reinforcement substrate 4 are obtained in a state of being supported by the other-side surface in the thickness direction of the pressure-sensitive adhesive sheet 2. That is, the pressure-sensitive adhesive sheet-including wiring circuit board 1 including the wiring circuit board 3 and the reinforcement substrate 4, and the pressure-sensitive adhesive sheet 2 disposed on the one-side surfaces in the thickness direction of these is produced.

Thereafter, as shown by the arrow of FIG. 9H, by moving the wiring circuit board 3 toward the other side in the thickness direction with respect to the pressure-sensitive adhesive sheet 2, the wiring circuit board 3 is peeled from the pressure-sensitive adhesive sheet 2.

(Function and Effect of Third Embodiment)

In the pressure-sensitive adhesive sheet-including wiring circuit board 1 and a producing method thereof, since the wiring circuit board 3 further includes the metal support layer 20, it is possible to obtain the wiring circuit board 3 having excellent toughness.

Further, in this method, as shown in FIG. 9F, since a portion around the wiring circuit board 3 in the support sheet 17 is removed, the wiring circuit board 3 can be reliably separated from the outer-side portion of the portion in the support sheet 17.

Fourth Embodiment

In the fourth embodiment, the same reference numerals are provided for members and steps corresponding to each of those in the first embodiment, the modified examples thereof, the second embodiment, and the third embodiment described above, and their detailed description is omitted. The fourth embodiment can achieve the same function and effect as that of the first embodiment, the modified examples thereof, the second embodiment, and the third embodiment unless otherwise specified. Furthermore, the first embodiment, the modified examples thereof, and the second to the fourth embodiments can be appropriately used in combination.

Figure 10A:
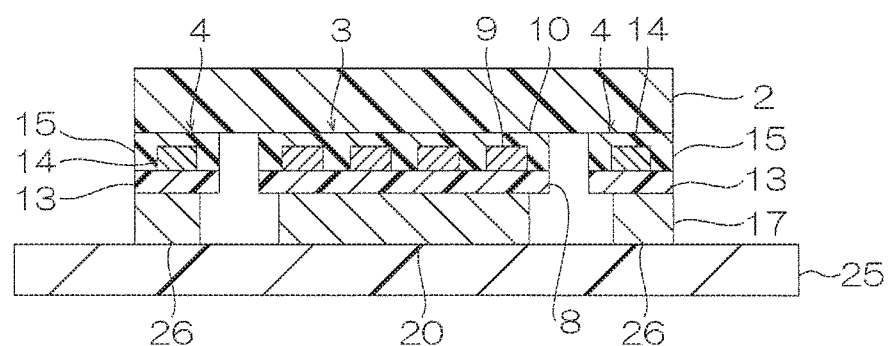
FIGS. 10A to 10B show cross-sectional views for illustrating a production process for explaining a sixth step of a fourth embodiment of the present invention.
Figure 10B:
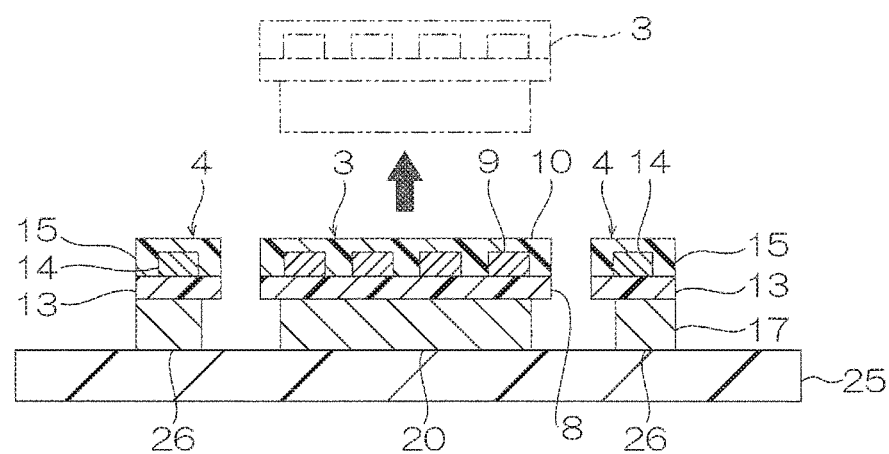

In the fourth embodiment, as shown in FIGS. 10A to 10B, the wiring circuit board 3 produced in the third embodiment and shown in FIG. 9G, together with the reinforcement substrate 4, is transferred to a second pressure-sensitive adhesive sheet 25 (sixth step).

Specifically, as shown in FIG. 10A, the second pressure-sensitive adhesive sheet 25 is brought into contact with (pressure-sensitively adheres to) the other-side surfaces in the thickness direction of the wiring circuit board 3 and the reinforcement substrate 4. The second pressure-sensitive adhesive sheet 25 has the same configuration as that of the pressure-sensitive adhesive sheet 2. However, a pressure-sensitive adhesive force of the second pressure-sensitive adhesive sheet 25 is larger than that of the pressure-sensitive adhesive sheet 2.

Thereafter, as shown in FIG. 10B, the pressure-sensitive adhesive sheet 2 is peeled from the one-side surfaces in the thickness direction of the wiring circuit board 3 and the reinforcement substrate 4.

Thus, the wiring circuit board 3 and the reinforcement substrate 4 are obtained in a state of being supported by the one-side surface in the thickness direction of the second pressure-sensitive adhesive sheet 25. That is, the pressure-sensitive adhesive sheet-including wiring circuit board 1 including the wiring circuit board 3 and the reinforcement substrate 4, and the second pressure-sensitive adhesive sheet 25 disposed on the other-side surfaces in the thickness direction of these is produced.

As shown by a phantom line and the arrow of FIG. 10B, by moving the wiring circuit board 3 toward one side in the thickness direction with respect to the second pressure-sensitive adhesive sheet 25, the wiring circuit board 3 is peeled from the second pressure-sensitive adhesive sheet 25.

(Function and Effect of Fourth Embodiment)

Then, since in this method, in the sixth step, the wiring circuit board 3 is transferred from the pressure-sensitive adhesive sheet 2 to the second pressure-sensitive adhesive sheet 25, as shown by the phantom line and the arrow of FIG. 10B, when the wiring circuit board 3 is separated from the second pressure-sensitive adhesive sheet 25, it is possible to easily obtain the wiring circuit board 3 without having the cut piece (cut end) described above.

In the third embodiment, as shown in FIG. 9G, the wiring circuit board 3 (the cover insulating layer 10) pressure-sensitively adheres to the other-side surface in the thickness direction of the pressure-sensitive adhesive sheet 2, and then, the wiring circuit board 3 is moved toward the other side in the thickness direction to obtain the wiring circuit board 3. In contrast, in the fourth embodiment, the wiring circuit board 3 (the metal support layer 20) pressure-sensitively adheres to the one-side surface in the thickness direction of the pressure-sensitive adhesive sheet 2, and then, the wiring circuit board 3 is moved toward one side in the thickness direction to obtain the wiring circuit board 3. Therefore, the third embodiment or the fourth embodiment is appropriately selected in accordance with the use of the wiring circuit board 3 depending on whether the wiring circuit board 3 pressure-sensitively adheres to either the one-side surface or the other-side surface in the thickness direction of the pressure-sensitive adhesive sheet 2, or whether the wiring circuit board 3 is moved in either direction of one side or the other side in the thickness direction.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF SYMBOLS

1 Pressure-sensitive adhesive sheet-including wiring circuit board
2 Pressure-sensitive adhesive sheet
3 Wiring circuit board
4 Reinforcement substrate
8 Base insulating layer
9 Conductive layer
Cover insulating layer
14 Reinforcement conductive layer
17 Support sheet
18 Second support sheet
20 Metal support layer
25 Second pressure-sensitive adhesive sheet
L Length (wiring circuit board)

The invention claimed is:

1. A pressure-sensitive adhesive sheet-including wiring circuit board comprising:
  the wiring circuit board including:
    a base insulating layer,
    a conductive layer disposed on a one-side surface in a thickness direction of the base insulating layer, and
    a cover insulating layer disposed on the one-side surface in the thickness direction of the base insulating layer so as to cover the conductive layer;
  a pressure-sensitive adhesive sheet disposed on the surface of either one side or the other side in the thickness direction of the wiring circuit board; and
  a reinforcement substrate surrounding an entire periphery of the wiring circuit board at intervals thereto in a plane direction perpendicular to the thickness direction of the wiring circuit board,
  wherein the pressure-sensitive adhesive sheet includes the wiring circuit board and the reinforcement substrate when projected in the thickness direction, and is continuous in the plane direction, and is disposed on the surface of the same side as the surface of the wiring circuit board in the reinforcement substrate, and
  wherein a width of an isolation region that is a distance between an outer peripheral surface of the wiring circuit board and an inner peripheral surface of the reinforcement substrate is 10 μm or more and 2000 μm or less.

2. The pressure-sensitive adhesive sheet-including wiring circuit board according to claim 1, wherein
  the wiring circuit board has a length of 300 mm or more.

3. The pressure-sensitive adhesive sheet-including wiring circuit board according to claim 1,
  wherein the reinforcement substrate includes a reinforcement conductive layer.

4. The pressure-sensitive adhesive sheet-including wiring circuit board according to claim 3,
  wherein the reinforcement conductive layer has a generally lattice shape when viewed from the top.

5. The pressure-sensitive adhesive sheet-including wiring circuit board according to claim 1,
  wherein the wiring circuit board further includes a metal support layer disposed on an other-side surface in the thickness direction of the base insulating layer.

* * * * *